Aug. 5, 1969 G. STRULL 3,460,006

SEMICONDUCTOR INTEGRATED CIRCUITS WITH IMPROVED ISOLATION

Filed Feb. 28, 1966

WITNESSES

Edwin E. Bassler

Leon M. Garman

INVENTOR

Gene Strull

BY Gordon H. Telfer

ATTORNEY

1

3,460,006

SEMICONDUCTOR INTEGRATED CIRCUITS WITH IMPROVED ISOLATION

Gene Strull, Pikesville, Md., assignor to Westinghouse Electric Corporation, Pittsburgh, Pa., a corporation of Pennsylvania Filed Feb. 28, 1966, Ser. No. 530,578
Int. Cl. H01l 19/00
U.S. Cl. 317—235 10 Claims

ABSTRACT OF THE DISCLOSURE

Electronic elements of an integrated circuit are combined within a unitary body but are isolated, at least from the substrate, by a layer of material whose resistivity is high, approaching intrinsic material. The high resistivity layer is followed by a subsequent layer or layers with diffused regions formed therein to complete the electronic elements.

Figure 1:
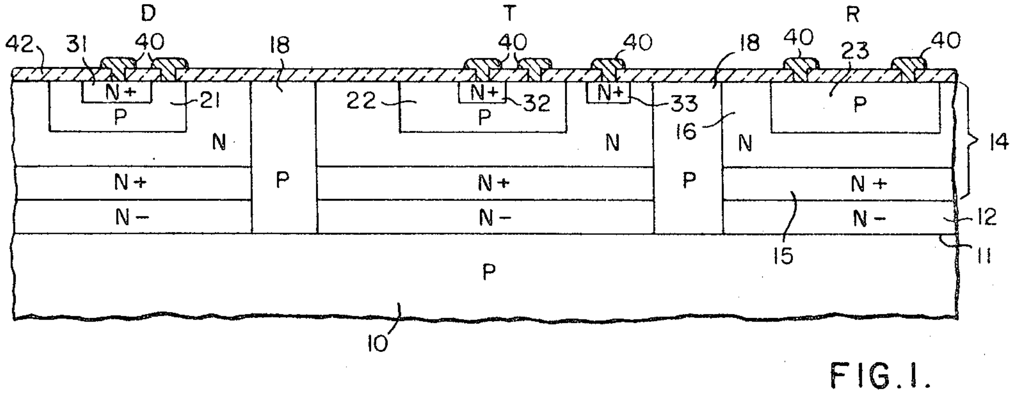

This invention relates generally to semiconductor integrated circuits wherein the functions of a plurality of individual components are provided within a unitary body having some means for minimizing undesired electrical interaction within the structure.

Previously it has been common to fabricate semiconductor integrated circuits wherein the active and passive electronic elements are internally isolated to a degree by a p-n junction, that can be maintained in reverse bias, between the elements and the common substrate. Diffused isolation walls between the elements also form p-n junctions that assist in providing isolation.

These prior art structures typically comprise a substrate of one type of conductivity, say p type, on which is grown an n type epitaxial layer that is then divided into discrete isolated portions by the diffusion of a p type isolation wall through it to the substrate. Individual elements are then fabricated in the isolated portions of the epitaxial layer using photolithographic and selective diffusion techniques.

The p-n junctions provided between adjacent elements and between the electronic elements and substrate provide several hundred megohms of DC isolation. However, the AC isolation is undesirably poor, particularly since it degrades with increasing frequency due to the capacitance of the p-n junction.

Recently, techniques have been proposed and investigated to secure an improvement in AC isolation by a complete physical separation of the individual elements of the integrated circuit with an insulating material such as silicon dioxide between them. Reference should be made to copending application Ser. No. 410,666, filed Nov. 12, 1964, by Murphy et al. and assigned to the assignee of the present invention, now abandoned, for further information on such types of structures.

Oxide isolated structures, however, require relatively difficult fabrication operations which, at present, would be preferable to avoid.

It is, therefore, an object of the present invention to provide improved semiconductor integrated circuits.

Another object is to provide semiconductor integrated circuits with improved internal isolation in both DC and AC senses without requiring fabrication operations that are difficult to practice.

The above and additional objects and advantages of the present invention are achieved in a structure wherein the electronic elements of the integrated circuit are combined with a monocrystalline semiconductor body but are isolated, at least from the substrate, by a layer of material whose resistivity is high (that is, one whose resisitivity approaches that of an intrinsic semiconductor material). The high resistivity layer is conveniently formed by epitaxial growth on the substrate. Following formation of the high resistivity layer, a subsequent layer or layers may be grown and diffusion operations performed as previously to complete the structure of the electronic elements.

2

The high resistivity layer is preferably of as high resistivity as can conveniently be formed. Marked improvement in isolation, particularly by reason of reducing the capacitance of the p-n junction with the substrate, results by forming the layer of material having at least 100 ohm-centimeter resistivity.

The portions of the functional elements may be latterally isolated by p-n junctions as previously with, however, substantial improvement in performance resulting because of the improved isolation from the substrate. Alternately, however, the structure may be formed with high resistivity portions enclosing the isolation walls for even greater improvement in isolation.

Figure 2:
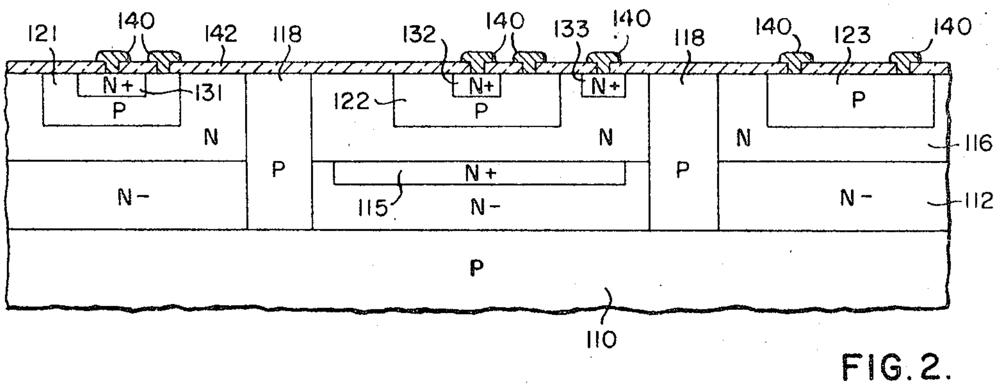
Figure 3:
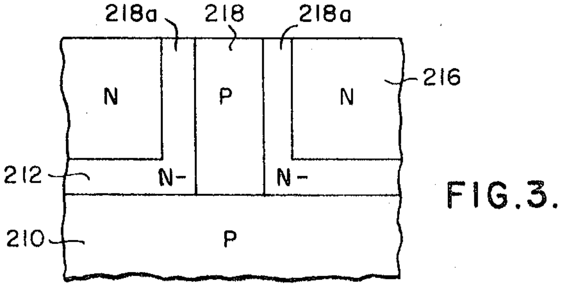

The invention, together with the above mentioned and additional objects and advantages thereof will be better understood by referring to the following descritpion taken with the accompanying drawing, wherein:

FIGURES 1, 2 and 3 are partial sectional views of integrated circuit structures embodying the present invention.

Referring to FIG. 1 a structure is shown including a substrate 10 of a first type of semiconductivity which in this example is of p type although it is to be understood that the conductivity type of the substrate, layers and regions of the structure may be reversed from that shown. On a first major surface 11 of the substrate 10 is a first layer 12 of n type material and a second layer 14, here shown in two portions 15 and 16, also of n type material. While it may seem preferable to refer to "layers" 15 and 16, they are herein called "portions" of layer 14 for greater consistency with embodiments such as FIG. 2. The first layer 12 is essentially the key element that provides the benefits of this invention while the second layer 14 may be of various forms in accordance with the prior art.

The second layer 14 is of a substantially lower resistivity than the first layer 12 and provides the portions of the structure in which electronic elements are fabricated by employing known photolithographic and selective diffusion techniques. The first layer 12, on the other hand, provides more effective electrical isolation particularly in the AC sense with the substrate 10 and permits fabrication of integrated circuits having better high frequency capability.

The structure also includes p-type isolation walls 18 separating the layers 12 and 14 into a plurality of portions with electronic functional elements in each of them. Three such portions and elements are illustrated. In the left-hand portion D is a diode structure including successively diffused p and n+ regions 21 and 31, respectively. In the center portion T is a transistor structure including successively diffused p and n+ regions 22 and 32 for the base and emitter, respectively, as well as an n+ region 33 to facilitate making low resistance ohmic contact to the underlying portion of the n type layer 16. In the right-hand portion R is a resistance structure including the p type region 23. Ohmic contacts 40 are shown in the drawing for the indicated regions.

The surface is otherwise covered with a passivation layer 42 such as one of silicon dioxide. The electronic elements illustrated are merely by way of example and it will be understood that they may take various forms in accordance with known technology while utilizing the improved isolation technique of the present invention.

The fabrication techniques required for fabricating the structure of FIG. 1 are thoroughly compatible with those existing and presently employed for the use in epitaxial-diffused integrated circuits. The structure of FIG. 1 is such that each of the layers and layer portions may be formed by epitaxial growth such as by the pyrolytic decomposition with hydrogen of a silicon compound such as silicon tetrachloride with an appropriate doping agent among the reactants. The first layer 12 is preferably as low doped as is conveniently possible so that it is close to intrinsic. It may have a resistivity as low as about 100 ohm-centimeters while still providing substantial improvement. It is designated in the drawing as of n— conductivity. Typically, resistivities in the range from about 100 ohm-centimeters to about 1000 ohm-centimeters are suitable.

The first portion of the second layer 14, designated as of n+ conductivity, is highly doped in accordance with known techniques to a resistivity in the range from about 0.01 to about 0.05 ohm-centimeter for the purpose of reducing saturation resistance in transistor structure primarily, in accordance with the teachings of Lin Patent 3,236,701, Feb. 22, 1966, which should be referred to for further information. The second portion 16 of the second layer 14 is chosen of resistivity desired for the collector of the transistor and may suitably have a resistivity in the range of from about 0.1 to about 5 ohm-centimeters. It will be recognized that layer 12 and both portions of layer 14 may be formed consecutively in a single reactor using the same reactants and merely varying the amount of dopant. There need not, of course, be an abrupt change in resistivity between the layers and layer portions.

Structures have been made similar to that shown in FIG. 1, however layer portion 15 was absent, and structures have also been made of essentially the same nature except for the absence of the n— layer 12 between the n layer 16 and the substrate 10. In one case, a 1 ohm-centimeter n type layer was formed on a 10 ohm-centimeter p substrate and in the other instance the 1-ohm-centimeter n type layer was separated from the substrate by a 200-ohm-centimeter layer and it was found that a reduction in coupling capacitance of about 5 to 1 resulted.

FIG. 2 illustrates a structure in many respects like that of FIG. 1 and corresponding elements are indicated by reference numerals having the same last two digits. FIG. 2 differs from that of FIG. 1 in that there is no N+ layer portion that extends throughout the functional elements of the structure. However, an n+ layer portion 115 is formed by diffusion in those portions of the structure where transistors are to be formed. Such technique is in accordance with the teaching of Murphy Patent 3,237,062, Feb. 22, 1966, which should be referred to for further information.

The structures of FIGS. 1 and 2 employ the high resistivity n— material only between the functional elements and the substrate and as indicated substantial improvement results. This will be better understood by recognition of the fact that the drawing is not to scale and that the thickness of the various regions is much exaggerated so that, in fact, the junction area between the functional elements and the substrate is of much greater magnitude than the area between the elements and the isolation walls 18 or 118.

Additional improvement in isolation may be achieved, although it may not be economical to do so, by providing high resiltivity material 218*a* surrounding the diffused isolation walls 218 as is illustrated in the partial structure shown in FIG. 3 where elements have reference numerals with the same last two digits as the corresponding elements of FIGS 1 and 2. This can be achieved in a two-step isolation diffusion. First, within the area intended to be occupied by both the high resistivity material and the p type isolation wall, p type impurities are diffused of a quantity such that the n type impurities of the epitaxial layer are not wholly compensated and result in high resistivity n— material. Following that diffusion another diffusion with p type impurities is performed to achieve the isolation wall 218 itself. Consequently, reduced AC capacitance can be achieved laterally as well as with the substrate.

In the various embodiments described the high resistivity material separating the functional elements from the substrate is designated as of n— conductivity, that is, opposite to that of the substrate and isolation walls. However, it is to be understood that substantial improvement can be achieved regardless of the particular conductivity type of the high resistivity material if it is of truly high resistivity such as at least 100 ohm-centimeters.

Consequently it would appear desirable to employ such a high resistivity material as the substrate. However, this is not usually practical for two reasons. The substrate is employed as a ground plane in many integrated circuit designs and here a lower resistivity is desirable. Also, a body of such high resistivity material is more expensive for most operations. Hence it is contemplated that as a matter of design and practical economics the high resistivity material must be formed by epitaxial growth or compensation diffusion as described herein. However, other diffusion and epitaxial growth schemes, such as those employing selective epitaxial growth, may be employed to achieve structures in accordance with this invention.

While the present invention has been shown and described in a few forms only it will be apparent that various changes and modifications may be made without departing from the spirit and scope thereof.

What is claimed is:

1. A semiconductor integrated circuit structure with improved internal electrical isolation comprising: a substrate of a first type of conductivity; a first layer having a resistivity of at least about 100 ohm-centimeters on a first major surface of said substrate; a second layer of a second type of conductivity on said first layer, said second layer being of substantially lower resistivity than said first layer; means for separating said first and second layers into a plurality of isolated regions; and at least two electronic functional elements, each in one of said plurality of isolated regions.

2. A semiconductor integrated circuit structure in accordance with claim 1 wherein: said substrate is of p type silicon; said second layer is of n type silicon and has a resistivity in the range from about 0.01 ohm-centimeter to about 5 ohm-centimeters; and said electronic functional elements comprise semiconductive regions solely within said second layer.

3. A semiconductor integrated circuit structure in accordance with claim 1 wherein: said second layer is of graded resistivity with a minimum resistivity adjacent said first layer and a maximum at the surface thereof remote from said first layer.

4. A semiconductor integrated circuit structure in accordance with claim 1 wherein: said means for separating said first and second layers comprises a wall of material of said first type of conductivity extending through said layers to said substrate and enclosing said isolated regions.

5. A semiconductor integrated circuit structure in accordance with claim 4 wherein: said means for separating said first and second layers also comprises a pair of walls of material disposed on opposite sides of said wall of said first type of conductivity, said pair of walls extending through said second layer to said first layer and having a resistivity substantially higher than that of said second layer.

6. A semiconductor integrated circuit structure in accordance with claim 1 wherein: said electronic functional elements include at least one bipolar transistor comprising a first region of said first type of semiconductivity in one of said isolated regions of said second layer and a second region of said second type of semiconductivity in said first region and an ohmic contact on each of said first and second regions and said one of said isolated regions of said second layer.

7. A semiconductor integrated circuit structure in accordance with claim 1 wherein: said substrate has lower resistivity than said first layer; said second layer comprises an initial layer portion adjacent said first layer and an additional layer portion, of higher resistivity than said initial layer portion, remote from said first layer; said initial layer portion underlying said additional layer portion in all of said plurality of isolated regions.

8. A semiconductor integrated circuit structure in accordance with claim 1 wherein: said substrate has lower resistivity than said first layer; said second layer comprises an initial layer portion adjacent said first layer and limited to only selected ones of said plurality of isolated regions; said second layer also comprises an additional layer portion, of higher resistivity than said initial layer portion, covering said first layer and said initial layer portion of said second layer.

9. A semiconductor integrated circuit structure in accordance with claim 1 wherein: said first layer is of said second type of conductivity.

10. A semiconductor integrated circuit structure in accordance with claim 1 wherein: said first layer is of said first type of conductivity.

References Cited

UNITED STATES PATENTS

| | | | |
|---|---|---|---|
| 3,260,902 | 7/1966 | Porter | 317—235 |
| 3,333,166 | 7/1967 | Hochman | 317—234 |

OTHER REFERENCES

IBM Tech. Disc. Bulletin, "Composite Semiconducting Elements," by Pou Pon, vol. 5, No. 4, September 1962, pages 31, 32.

IBM Tech. Disc. Bulletin, "Making Monolithic Semiconductor Structure . . ." by Doo et al., vol. 8, No. 4, September 1965, pages 659–660.

IBM Tech. Disc. Bulletin, "Junction Isolation for Isolating . . ." by Doo, vol. 8, No. 4, September 1965, pages 668–669.

Motorola Monitor, vol. 2, No. 2, June 1964, page 14.

JOHN W. HUCKERT, Primary Examiner

JERRY D. CRAIG, Assistant Examiner

U.S. Cl. X.R.

148—175